United States Patent
Yamamoto et al.

(10) Patent No.: US 10,158,067 B2
(45) Date of Patent: Dec. 18, 2018

(54) MEMORY DEVICE

(71) Applicant: TOSHIBA MEMORY CORPORATION, Minato-ku, Tokyo (JP)

(72) Inventors: Kazuhiko Yamamoto, Yokkaichi Mie (JP); Yosuke Murakami, Yokkaichi Mie (JP); Yusuke Arayashiki, Yokkaichi Mie (JP); Yusuke Kobayashi, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/696,119

(22) Filed: Sep. 5, 2017

(65) Prior Publication Data

US 2018/0277753 A1    Sep. 27, 2018

(30) Foreign Application Priority Data

Mar. 24, 2017    (JP) .................. 2017-060008

(51) Int. Cl.
  *H01L 27/24* (2006.01)
  *H01L 45/00* (2006.01)
  *G11C 13/00* (2006.01)

(52) U.S. Cl.
  CPC .......... *H01L 45/08* (2013.01); *G11C 13/0007* (2013.01); *H01L 45/1233* (2013.01); *H01L 45/146* (2013.01); *H01L 45/148* (2013.01); *G11C 13/004* (2013.01); *G11C 2013/0045* (2013.01); *G11C 2213/32* (2013.01); *G11C 2213/33* (2013.01); *G11C 2213/51* (2013.01);
(Continued)

(58) Field of Classification Search
  CPC ..... H01L 27/24; H01L 27/2409; H01L 45/04; H01L 45/08; H01L 45/1233; H01L 45/146; H01L 45/148; G11C 2213/32
  See application file for complete search history.

(56) References Cited

U.S. PATENT DOCUMENTS 8,432,720 B2    4/2013    Awaya et al.
8,450,713 B2    5/2013    Awaya et al.
(Continued)

OTHER PUBLICATIONS

B. Govoreanu et al., "Advanced a-VMCO resistive switching memory through inner interface engineering with wide (>$10^2$) on/off window, tunable µA-range switching current and excellent variability", 2016 Symposium on VLS1 Tech. Digest of Technical Papers, 978-1-5090-0638-0/16 © 2016 IEEE, pp. 82-83.
(Continued)

*Primary Examiner* — David Spalla
(74) *Attorney, Agent, or Firm* — Foley & Lardner LLP

(57) ABSTRACT

A memory device includes a first conductive layer, a second conductive layer, and a variable resistance layer provided between the first and second conductive layers. The variable resistance layer includes a first layer having a semiconductor or a first metal oxide containing a first metal, and a second layer provided between the first layer and the second conductive layer, having a second metal oxide containing a second metal, and having crystal grains that are not in contact with at least one of an end face of the second layer on a side of the first conductive layer or an end face of the second layer on a side of the second conductive layer.

19 Claims, 8 Drawing Sheets

(52) U.S. Cl.
CPC ...... *G11C 2213/52* (2013.01); *G11C 2213/55* (2013.01); *H01L 27/2463* (2013.01); *H01L 45/1253* (2013.01)

(56) References Cited

U.S. PATENT DOCUMENTS

| | | | |
|---|---|---|---|
| 9,246,085 B1 * | 1/2016 | Wang | H01L 45/08 |
| 9,252,358 B2 | 2/2016 | Kanno et al. | |
| 2013/0075686 A1 * | 3/2013 | Kawasaki | H01L 45/085 |
| | | | 257/4 |
| 2014/0339488 A1 * | 11/2014 | Kang | H01L 45/146 |
| | | | 257/2 |
| 2014/0346435 A1 * | 11/2014 | Wu | H01L 45/08 |
| | | | 257/5 |

OTHER PUBLICATIONS

B. Govoreanu et al., "Vacancy-Modulated Conductive Oxide Resistive RAM (VMCO-RRAM): An Area-Scalable Switching Current, Self-Compliant, Highly Nonlinear and Wide on/Off-Window Resistive Switching Cell", IEDM13-256, 978-1-4799-2306-9/13 © 2013 IEEE, pp. 10.2.1-10.2.4.

* cited by examiner

MEMORY DEVICE

CROSS-REFERENCE TO RELATED APPLICATION

This application claims the benefit of and priority to Japanese Patent Application No. 2017-060008, filed on Mar. 24, 2017, the entire contents of which are incorporated herein by reference.

FIELD

Embodiments described herein relate generally to a memory device.

BACKGROUND

In a variable resistance memory, a transition between the high resistance state and the low resistance state is caused by applying a current to a variable resistance layer of a memory cell. For example, when the high resistance state is defined as data "0" and the low resistance state is defined as data "1," the memory cell is able to store 1-bit data of "0" and "1." The transition between the high resistance state and the low resistance state may be repeatedly performed.

DETAILED DESCRIPTION

Figure 1:
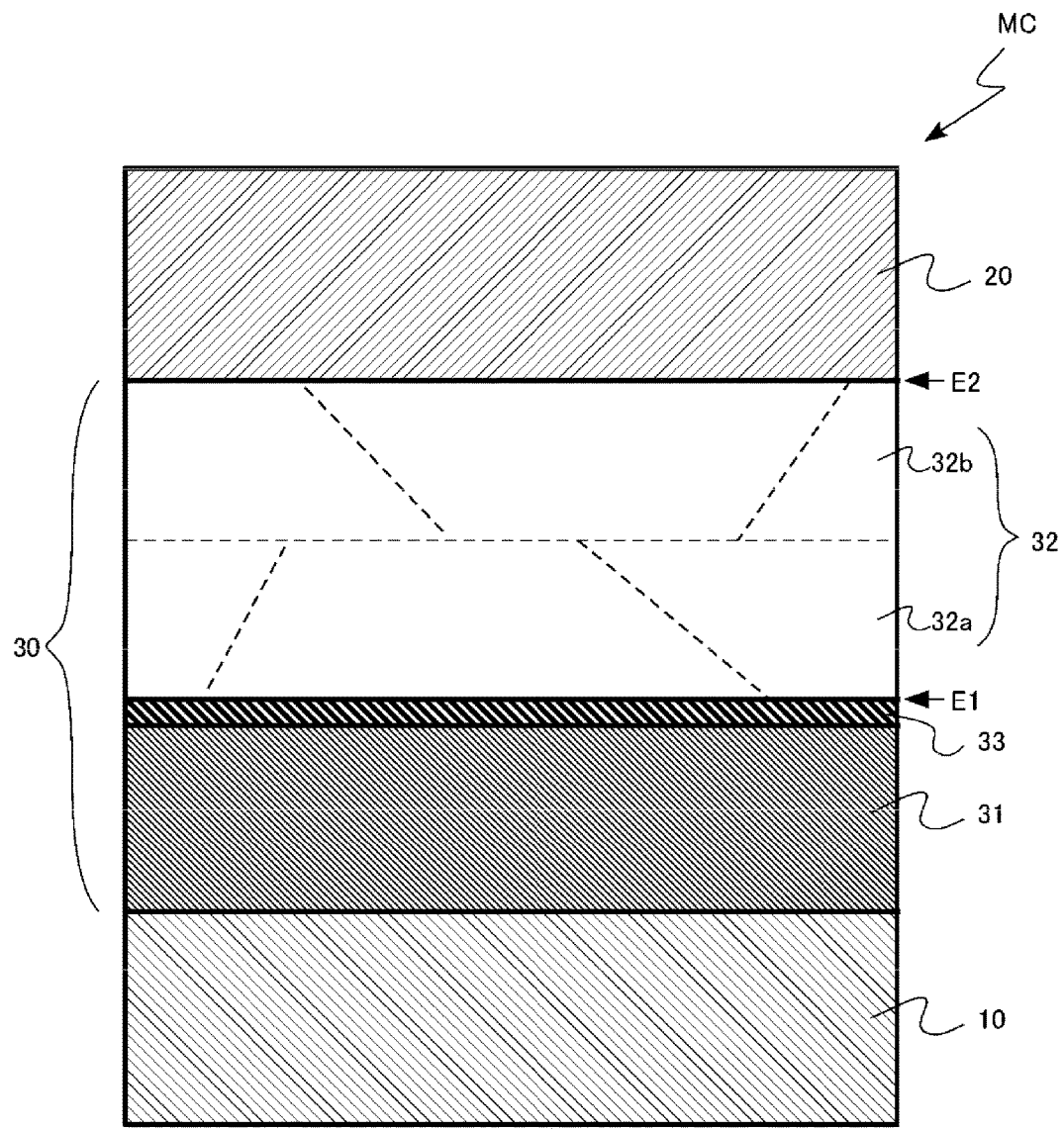
FIG. 1 is a schematic cross-sectional view of a memory cell of a memory device according to some embodiments.

In order to ensure the reliability of a variable resistance memory, the characteristics of a memory cell should not be deteriorated even when the transition between a high resistance state and a low resistance state is repeatedly performed. An example embodiment provides a memory device of which reliability may be improved.

In general, according to some embodiments, the memory device may include a first conductive layer, a second conductive layer, and a variable resistance layer provided between the first and second conductive layers. The variable resistance layer may include a first layer having a semiconductor or a first metal oxide containing a first metal, and a second layer provided between the first layer and the second conductive layer, having a second metal oxide containing a second metal, and having crystal grains that are not in contact with at least one of an end face of the second layer on a side of the first conductive layer and an end face of the second layer on a side of the second conductive layer.

Hereinafter, example embodiments of the present disclosure will be described with reference to the drawings. Meanwhile, in the following descriptions, identical or similar components will be denoted by common reference numerals, and thus, repeated descriptions of a component described once or the like will be appropriately omitted.

For convenience, in the descriptions, the terms "upper" and "lower" will be used. The terms "upper" and "lower" indicate the relative positional relationship in a drawing and do not regulate the position relationship with respect to the gravity.

Hereinafter, a memory device of each example embodiment will be described with reference to the drawings.

A memory device according to some embodiments may include a first conductive layer, a second conductive layer, and a variable resistance layer provided between the first and second conductive layers. The variable resistance layer may include a first layer having a semiconductor or a first metal oxide containing a first metal, and a second layer provided between the first layer and the second conductive layer, having a second metal oxide containing a second metal, and having crystal grains that are not in contact with at least one of an end face of the second layer on a side of the first conductive layer and an end face of the second layer on a side of the second conductive layer.

Figure 2:
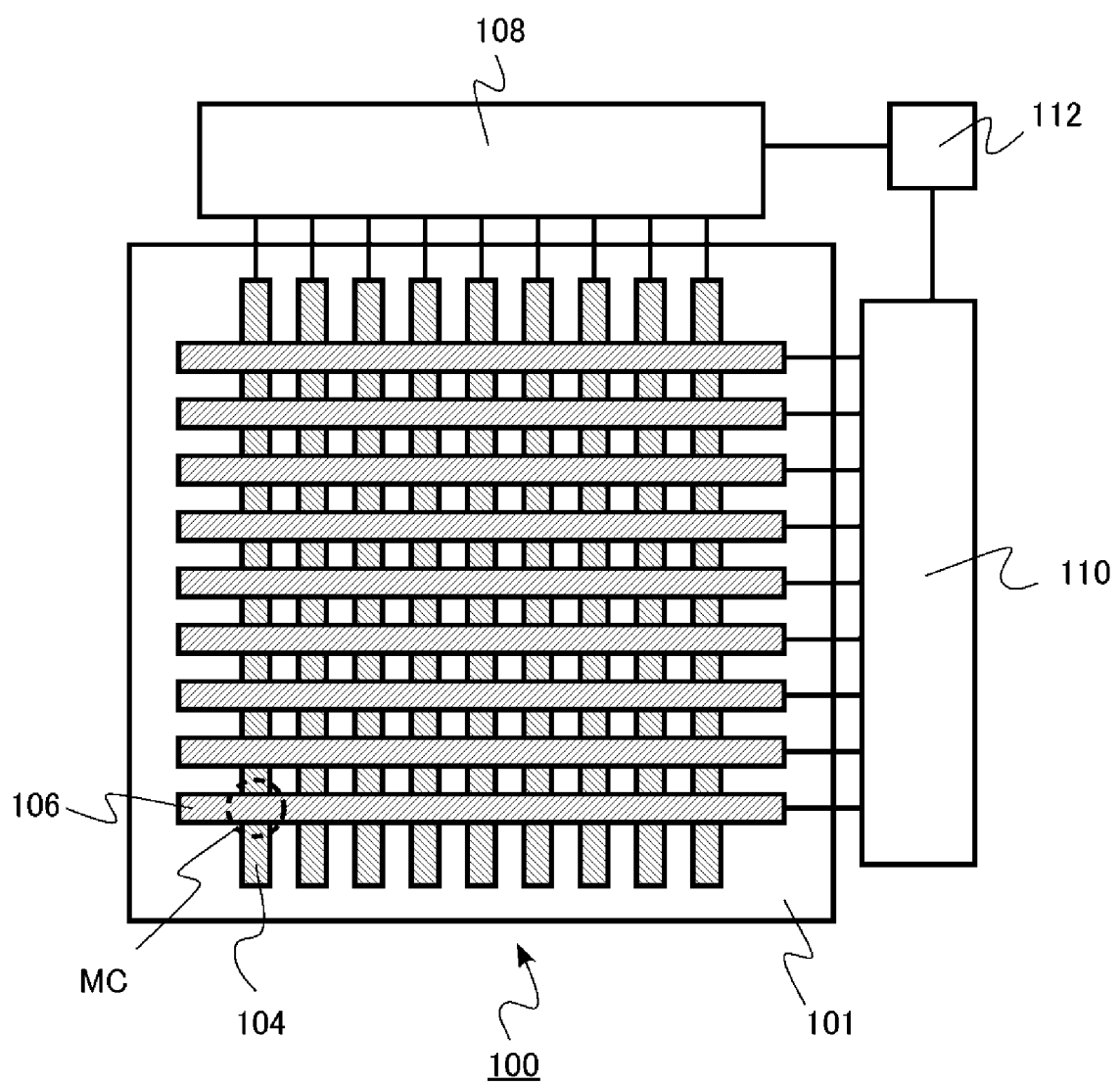
FIG. 2 is a block diagram of the memory device according to some embodiments.

FIG. 1 is a schematic cross-sectional view of a memory cell MC of the memory device of some embodiments. FIG. 2 is a block diagram of a memory cell array 100 and peripheral circuits of the memory device of some embodiments. FIG. 1 illustrates the cross-section of one memory cell MC indicated by, for example, the dashed circle in the memory cell array 100 of FIG. 2.

The memory cell array 100 of the memory device of some embodiments may include a plurality of word lines 104 and a plurality of bit lines 106 crossing the word lines 104, via an insulating layer on a semiconductor substrate 101. The bit lines 106 may be provided above the word lines 104. In some embodiments, a first control circuit 108, a second control circuit 110, and a sense circuit 112 may be provided as the peripheral circuits around the memory cell array 100.

A plurality of memory cells MC may be provided in the regions where the word lines 104 and the bit lines 106 cross each other. The memory device of some embodiments may be a variable resistance memory having the cross point structure. Each memory cell MC may be a two-terminal variable resistance element.

Each of the plurality of word lines 104 may be connected to the first control circuit 108. Each of the plurality of bit lines 106 may be connected to the second control circuit 110. The sense circuit 112 may be connected to the first control circuit 108 and the second control circuit 110.

The first control circuit 108 and the second control circuit 110 may have functions of selecting, for example, a desired memory cell MC and writing data in the memory cell MC, reading data of the memory cell MC, erasing data of the memory cell MC, and the like. When reading data, the data of the memory cell maybe read as an amount of a current flowing between the word lines 104 and the bit lines 106. The sense circuit 112 may have a function of determining the polarity of the data by determining the amount of a current. For example, the sense circuit 112 may determine "0" or "1" of the data.

The first control circuit 108, the second control circuit 110, and the sense circuit 112 may be configured with, for example, electronic circuits using semiconductor devices formed on the semiconductor substrate 101.

As illustrated in FIG. 1, the memory cell MC includes a lower electrode 10 (as the first conductive layer), an upper electrode 20 (as the second conductive layer), and a variable resistance layer 30.

The lower electrode 10 may be connected to a word line 104. The lower electrode 10 may be, for example, a metal. The lower electrode 10 may be, for example, titanium nitride (TiN) or tungsten (W).

The upper electrode 20 may be connected to a bit line 106. The upper electrode 20 may be, for example, a metal. The upper electrode 20 may be, for example, titanium nitride (TiN) or tungsten (W).

The variable resistance layer 30 maybe sandwiched between the lower electrode 10 and the upper electrode 20. The variable resistance layer 30 may include a high resistance layer 31 (as the first layer), a low resistance layer 32 (as the second layer), and a reaction preventing layer 33 (as a third layer).

The film thickness of the variable resistance layer 30 may be, for example, 5 nm or more and 25 nm or less. The variable resistance layer 30 may be, for example, a film formed by the atomic layer deposition (ALD) method.

The high resistance layer 31 may have a semiconductor or a first metal oxide containing a first metal. The high resistance layer 31 may be, for example, an amorphous semiconductor or an amorphous metal oxide.

The high resistance layer 31 may be, for example, a semiconductor. The high resistance layer 31 may be, for example, silicon, germanium, or a compound thereof. The high resistance layer 31 may be, for example, amorphous silicon or amorphous germanium.

The high resistance layer 31 may be, for example, a first metal oxide containing a first metal. The first metal may be at least one of aluminum (Al), hafnium (Hf), zirconium (Zr), tantalum (Ta), and niobium (Nb). The high resistance layer 31 may be an aluminum oxide, hafnium oxide, zirconium oxide, tantalum oxide, niobium oxide, and compounds thereof.

The film thickness of the high resistance layer 31 may be, for example, 1 nm or more and 10 nm or less.

The low resistance layer 32 may have a second metal oxide containing a second metal. The second metal may be at least one of titanium (Ti), niobium (Nb), tantalum (Ta), and tungsten (W). The low resistance layer 32 may be, for example, a titanium oxide, niobium oxide, tantalum oxide, or tungsten oxide. For example, the second metal may be different from the first metal. The low resistance layer 32 may be a metal oxide which is identical in type to the high resistance layer 31 but has a different electrical resistance from that of the high resistance layer 31. For example, the high resistance layer 31 may be an amorphous titanium oxide, and the low resistance layer 32 may be a crystallized titanium oxide.

The low resistance layer 32 may have a lower resistivity than that of the high resistance layer 31. At least a portion of the low resistance layer 32 may be crystalline. The resistivity may be lowered by crystallizing the second metal oxide of the low resistance layer 32. The crystallization ratio of the metal oxide of the low resistance layer 32 may be higher than the crystallization ratio of the first metal oxide of the high resistance layer 31. The crystallization ratio of the metal oxide may be measured by, for example, a transmission electron microscope (TEM).

The film thickness of the low resistance layer 32 may be, for example, 3 nm or more and 15 nm or less.

The reaction preventing layer 33 may have an oxide or a nitride. The reaction preventing layer 33 may be, for example, an amorphous oxide or an amorphous nitride.

The reaction preventing layer 33 may be an oxide or a nitride containing at least one of aluminum (Al), silicon (Si), and germanium (Ge). The reaction preventing layer 33 may be, for example, an aluminum oxide, silicon oxide, germanium oxide, aluminum nitride, silicon nitride, or germanium nitride.

The reaction preventing layer 33 may have a different composition from those of the high resistance layer 31 and the low resistance layer 32. The reaction preventing layer 33 may have a function of preventing the reaction between the high resistance layer 31 and the low resistance layer 32.

The film thickness of the reaction preventing layer 33 may be, for example, 0.2 nm or more and 1 nm or less. The film thickness of the reaction preventing layer 33 may be 1 nm or less from the viewpoint of facilitating the movement of carriers and oxygen ions.

By applying a current to the variable resistance layer 30, the variable resistance layer 30 maybe changed from the high resistance state to the low resistance state or from the low resistance state to the high resistance state. The change from the high resistance state to the low resistance state is referred to as, for example, a set operation. The change from the low resistance state to the high resistance state is referred to as, for example, a reset operation.

By the application of a current to the variable resistance layer 30, oxygen ions may be moved between the high resistance layer 31 and the low resistance layer 32 so that an oxygen deficiency amount (e.g., an oxygen vacancy amount) in the low resistance layer 32 can be changed. The conductivity of the variable resistance layer 30 may be changed according to the oxygen deficiency amount in the low resistance layer 32. The low resistance layer 32 may be a so-called vacancy modulated conductive oxide.

For example, the high resistance state is defined as data "0," and the low resistance state is defined as data "1." The memory cell MC is able to store 1-bit data of "0" and "1."

The low resistance layer 32 may be a polycrystalline layer. The low resistance layer 32 may include a lower region 32a (as a first region) and an upper region 32b (as a second region). Crystal grains maybe divided between the lower region 32a and the upper region 32b. Thus, the low resistance layer 32 may have crystal grains that are not in contact with at least one of the end face E1 on the side of the lower electrode 10 and the end face E2 on the side of the upper electrode 20.

In FIG. 1, crystal grain boundaries (or grain boundaries) are indicated by dashed lines. It is possible that the crystal grains are not in contact with both the end face E1 and the end face E2.

Whether there exist crystal grains that are not in contact with at least one of the end face E1 on the side of the lower electrode 10 and the end face E2 on the side of the upper electrode 20 may be determined by, for example, observing the cross-section of the variable resistance layer 30 with a TEM.

For example, the structure in which crystal grains are divided may be formed by separately performing the film formations of the lower region 32a and the upper region 32b when forming the low resistance layer 32.

In addition, the film thickness of each layer may be measured using, for example, a TEM.

Subsequently, the operation and effects of the memory device of some embodiments will be described.

In the variable resistance memory in which the conductivity of the variable resistance layer 30 is changed by using the change of the oxygen deficiency amount, the characteristics of the memory cell MC may be deteriorated due to the repetition of the set operation and the reset operation. Specifically, the resistance ratio between the high resistance state and the low resistance state may become small. Otherwise, a large current may flow through the variable resistance layer thereby causing an insulation breakdown. In some embodiments, the deterioration of the characteristics of the memory cell MC can be prevented and the reliability of the variable resistance memory can be improved.

Figure 3:
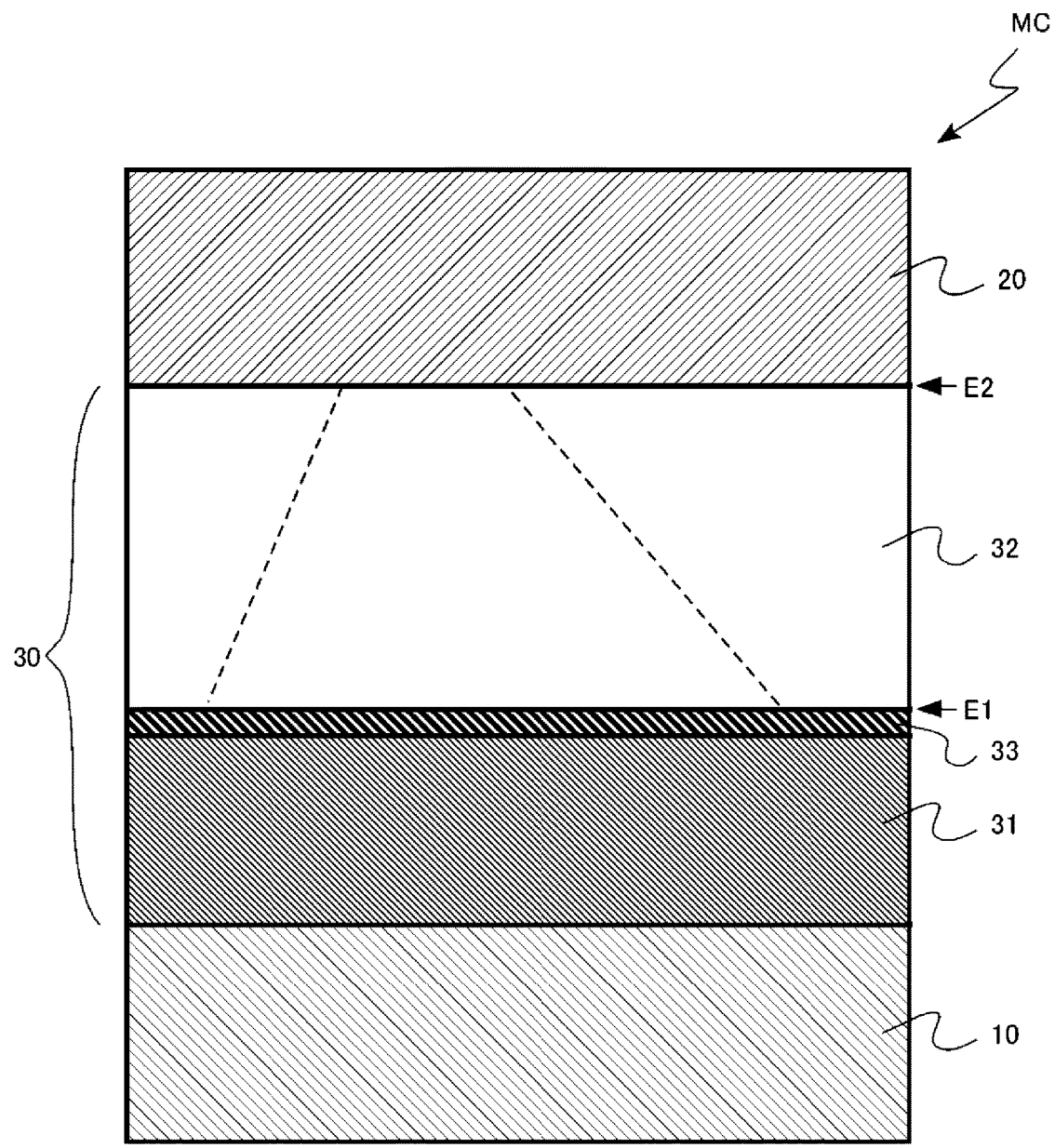
FIG. 3 is an explanatory view of an operation and effects of the memory device of some embodiments.

FIG. 3 is an explanatory diagram of the operation and effects of the memory device of some embodiments. FIG. 3 is a schematic cross-sectional view of a memory cell MC of a memory device of a comparative example.

In the memory cell MC of the comparative example, the crystal grains are formed as single-crystal grains in the film thickness direction of the low resistance layer 32. In other words, the crystal grains in the low resistance layer 32 are in contact with both the end face E1 on the side of the lower electrode 10 and the end face E2 on the side of the upper electrode 20. When the film formation of the low resistance layer 32 is continuously performed, the crystal grains tend to be formed as single-crystal grains in the thickness direction of the low resistance layer 32.

When a current flows between the lower electrode 10 and the upper electrode 20, the metal of the low resistance layer 32 or the metal of the upper electrode 20 may pass through the crystal grain boundaries of the low resistance layer 32 and diffuse into the high resistance layer 31. The metal diffused into the high resistance layer 31 forms a metal filament having a low resistance in the high resistance layer 31, thereby causing a deterioration of the characteristics of the memory cell MC.

In the memory cell MC of the comparative example, since the crystal grains are formed as single-crystal grains in the film thickness direction of the low resistance layer 32, the crystal grain boundaries are formed in a short distance between the upper electrode 20 and the high resistance layer 31. Thus, the diffusion of the metal into the high resistance layer 31 may easily occur. As a result, the deterioration of the characteristics of the memory cell MC may easily occur.

For example, when the reaction preventing layer 33 is provided between the high resistance layer 31 and the low resistance layer 32, the reaction preventing layer 33 also functions as a barrier for the diffusion of the metal. However, this function may not be sufficient in preventing the deterioration of the characteristics of the memory cell MC.

In the memory cell MC of some embodiments, the crystal grains may be divided within the low resistance layer 32. Thus, the distance of the crystal grain boundaries between the upper electrode 20 and the high resistance layer 31 may be longer than that in the comparative example (see FIG. 3). Accordingly, the diffusion of the metal into the high resistance layer 31 can be prevented. As a result, the deterioration of the characteristics of the memory cell MC can be prevented, and the reliability of the memory device can be improved.

In addition, when the crystal grains are formed as single-crystal grains in the film thickness direction of the low resistance layer 32 as in the memory cell MC of the comparative example, the film thickness of the low resistance layer 32 may be increased in order to prevent the diffusion of the metal into the high resistance layer 31. Thus, the downsizing of the memory cell MC is hindered.

In the memory cell MC of some embodiments, since the crystal grains are divided within the low resistance layer 32, the low resistance layer 32 may be made thin. Thus, the downsizing of the memory cell MC may be implemented.

FIG. 1 exemplifies the case where, within the low resistance layer 32, the crystal grains are in contact with at least one of the end face E1 on the side of the lower electrode 10 and the end face E2 on the side of the upper electrode 20. However, the crystal grains may not be in contact with the end face E1 or the end face E2. For example, by dividing the crystal grains into areas having three or more layers, the diffusion of the metal may be further prevented.

In some embodiments, the reaction preventing layer 33 may be provided. However, in some embodiments, the reaction preventing layer 33 may not be necessarily provided, for example, as long as a material having low reactivity is used for the high resistance layer 31 and the low resistance layer 32.

As described above, according to some embodiments, the diffusion of the metal through the crystal grain boundaries as routes in the low resistance layer 32 can be prevented, and the deterioration of the characteristics of the memory cell MC can be prevented. Thus, the memory device of which reliability may be improved may be implemented. Further, the downsizing of the memory cell MC may be implemented.

A memory device of some embodiments may include a first conductive layer, a second conductive layer, and a variable resistance layer provided between the first and second conductive layers. The variable resistance layer may include a first layer having a semiconductor or a first metal oxide containing a first metal, and a second layer provided between the first layer and the second conductive layer, having a second metal oxide containing a second metal, and including a first region having a first average grain size (e.g., diameter or other characteristic dimension) and a second region provided between the first region and the second conductive layer and having a second average grain size (e.g., diameter or other characteristic dimension) smaller than the first average grain size.

The memory device of some embodiments is different from the embodiments illustrated in FIG. 1 to FIG. 2 in the structure of the second layer. Hereinafter, descriptions overlapping with those of the embodiments illustrated in FIG. 1 to FIG. 2 will be omitted.

Figure 4:
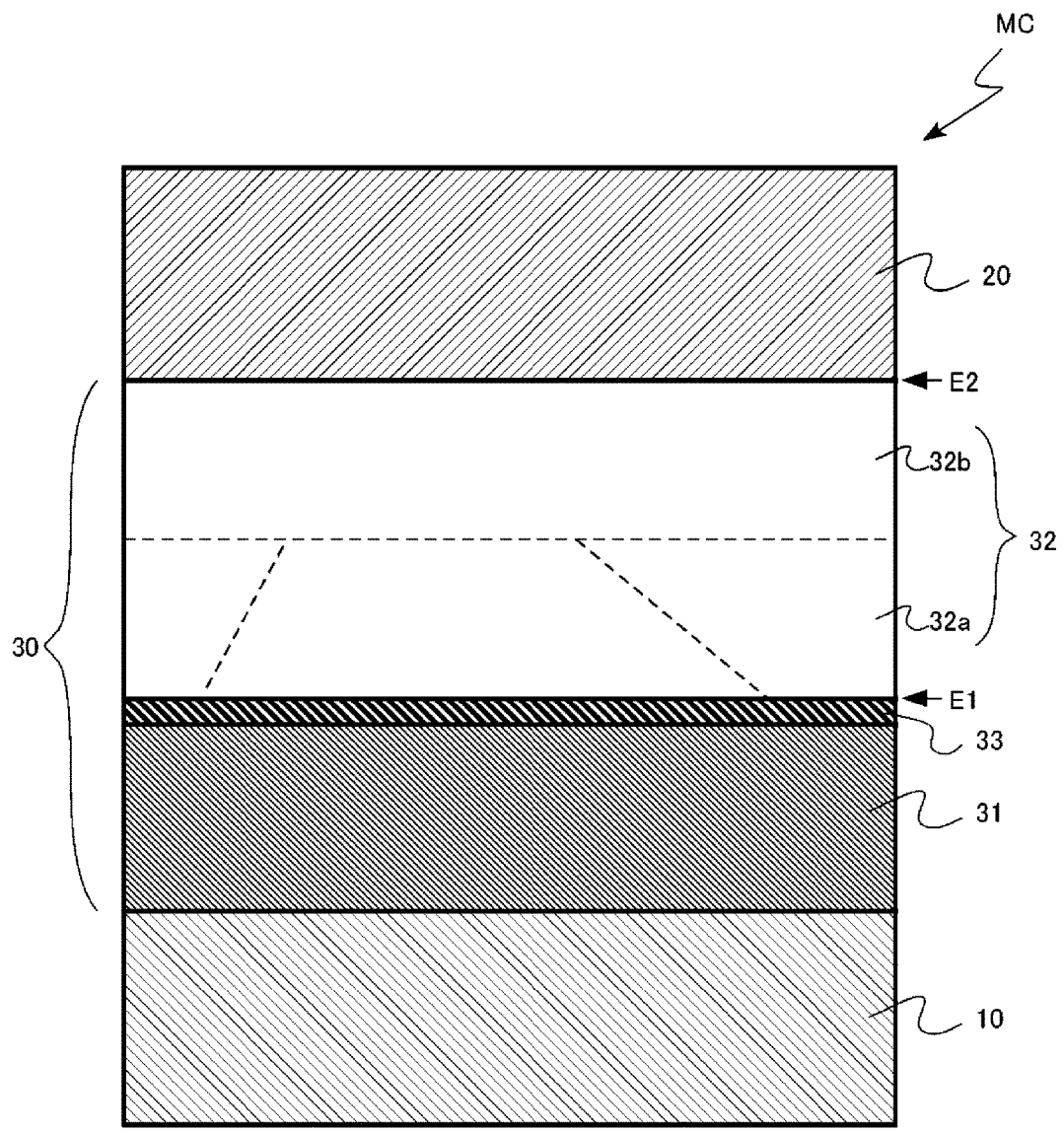
FIG. 4 is a schematic cross-sectional view of a memory cell of a memory device according to some embodiments.

FIG. 4 is a schematic cross-sectional view of a memory cell MC of the memory device of some embodiments.

The low resistance layer 32 may include a lower region 32a (as the first region) and an upper region 32b (as the second region). The upper region 32b may be provided between the lower region 32a and the upper electrode 20. The average grain diameter (as the second average grain diameter) of the crystal grains of the upper region 32b may be smaller than the average grain diameter (as the first average grain diameter) of the crystal grains of the lower region 32a.

The lower region 32a may be polycrystalline. The upper region 32b may be microcrystalline or amorphous. The lower region 32a in contact with the reaction preventing layer 33 may be crystallized so as to have a low resistance. In addition, the oxygen deficiency may be generated in this region.

The average grain diameter of the crystal grains may be measured by, for example, observing the cross-section of the low resistance layer 32 with a TEM. For example, the maximum diameters of a plurality of crystals present in a predetermined region of the low resistance layer 32 observed by a TEM may be randomly measured, and an average grain diameter may be calculated by averaging the maximum diameters. For example, when the predetermined region is amorphous and the maximum diameters may not be measured by the TEM, the average grain diameter of the region may be calculated as zero.

In some embodiments, the low resistance layer 32 may have crystal grains that are not in contact with at least one of the end face E1 on the side of the lower electrode 10 and the end face E2 on the side of the upper electrode 20.

For example, when forming the low resistance layer 32, the film formations of the lower region 32a and the upper region 32b may be separately formed from each other, and the average grain diameter may be changed by causing the heat history applied to the lower region 32a to be longer than the heat history applied to the upper region 32b. In some embodiments, the average grain diameter may be changed by changing the film formation temperatures of the lower region 32a and the upper region 32b.

Further, the average grain diameter may be changed by changing the compositions of the metal oxides in the lower region 32a and the upper region 32b. For example, the average grain diameter of the upper region 32b may be made small by forming the lower region 32a of a titanium aluminum oxide in which the amount ratio of titanium (Ti) is larger than that of stoichiometry, and forming the upper region 32b of a titanium aluminum oxide in which the amount ratio of aluminum (Al) is larger than that of stoichiometry.

In the memory cell MC of some embodiments, the crystal grains may be divided within the low resistance layer 32. Thus, the distance of the crystal grain boundaries between the upper electrode 20 and the high resistance layer 31 may be increased. Therefore, the diffusion of the metal into the high resistance layer 31 can be prevented. As a result, the deterioration of the characteristics of the memory cell MC can be prevented, and the reliability of the memory device can be improved.

Especially, since the diameters of the crystal grains in the upper region 32b are small, the distance of the crystal grain boundaries between the upper electrode 20 and the high resistance layer 31 may be further increased. Thus, the diffusion of the metal into the high resistance layer 31 can be further prevented, and the reliability of the memory device can be improved.

From the viewpoint of eliminating the crystal grain boundaries in the upper region 32b so as to further prevent the diffusion of the metal, the upper region 32b may be amorphous. That is, the average grain diameter (as the second average grain diameter) of the crystal grains in the low resistance layer 32 may be zero.

According to some embodiments, the low resistance layer 32 may be made thin. Thus, the downsizing of the memory cell MC may be implemented.

As described above, according to some embodiments, the memory device of which reliability may be improved to the same extent as or greater than the embodiments illustrated in FIG. 1 to FIG. 2 may be implemented. Further, the downsizing of the memory cell MC may be implemented.

A memory device of some embodiments is different from that of the embodiments illustrated in FIG. 4 in that the second layer of the embodiments illustrated in FIG. 4 has a third region provided between the second region and the second conductive layer and having a third average grain size (e.g., diameter or other characteristic dimension) larger than the second average grain size (e.g., diameter or other characteristic dimension), and the second region of the embodiments illustrated in FIG. 4 has a different composition from those of the first and third regions. Hereinafter, descriptions overlapping with those of the embodiments illustrated in FIG. 4 will be omitted.

Figure 5:
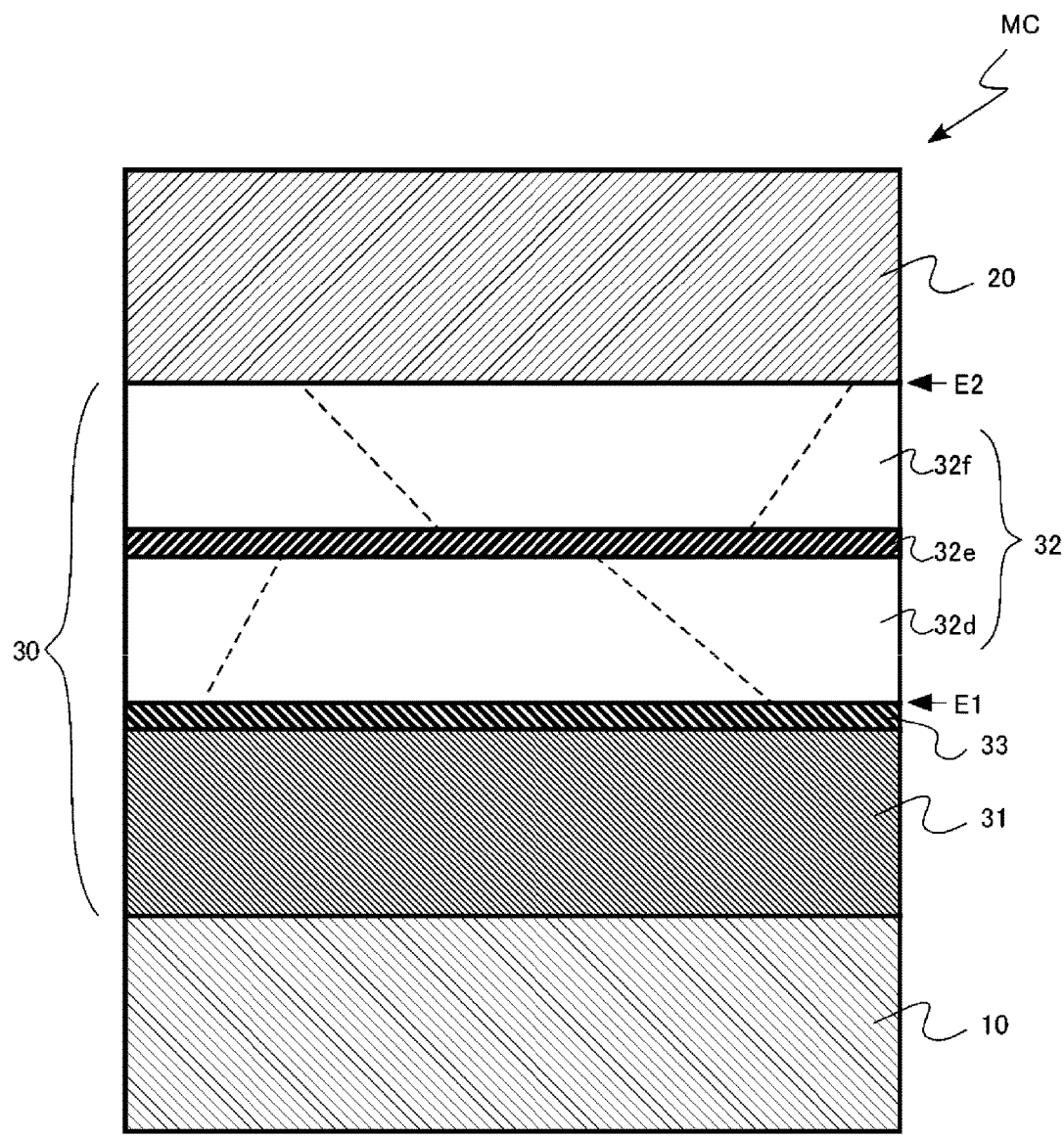
FIG. 5 is a schematic cross-sectional view of a memory cell of a memory device according to some embodiments.

FIG. 5 is a schematic cross-sectional view of a memory cell MC of the memory device of some embodiments.

The low resistance layer 32 may include a lower region 32d (as the first region), an intermediate region 32e (as the second region), and an upper region 32f (as the third region). The average grain diameter (as the second average grain diameter) of the crystal grains of the intermediate region 32e may be smaller than the average grain diameter (as the first average grain diameter) of the crystal grains of the lower region 32d. Further, the average grain diameter (as a third average grain diameter) of the upper region 32f may be larger than the average grain diameter (as the second average grain diameter) of the crystal grains of the intermediate region 32e.

The lower region 32d and the upper region 32f may be polycrystalline. The intermediate region 32e may be microcrystalline or amorphous.

The lower region 32d and the upper region 32f may be formed of a metal oxide containing at least one of titanium (Ti), niobium (Nb), tantalum (Ta), and tungsten (W). The lower region 32d and the upper region 32f may be formed of, for example, a titanium oxide, niobium oxide, tantalum oxide, or tungsten oxide. The lower region 32d and the upper region 32f may have the same composition or different compositions.

The intermediate region 32e may have a different composition from those of the lower region 32d and the upper region 32f. The intermediate region 32e may be formed of an oxide or a nitride containing at least one of aluminum (Al), silicon (Si), and germanium (Ge). The intermediate region 32e maybe formed of, for example, an aluminum oxide, silicon oxide, germanium oxide, aluminum nitride, silicon nitride, or germanium nitride.

The film thickness of the intermediate region 32e may be, for example, 0.2 nm or more and 1 nm or less. The film thickness of the intermediate region 32e may be 1 nm or less from the viewpoint of facilitating the movement of carriers or oxygen ions.

In some embodiments, the low resistance layer 32 may have crystal grains that are not in contact with at least one of the end face E1 on the side of the lower electrode 10 and the end face E2 on the side of the upper electrode 20.

In the memory cell MC of some embodiments, the crystal grains may be divided within the low resistance layer 32 by the intermediate region 32e. Thus, the distance of the crystal grain boundaries between the upper electrode 20 and the high resistance layer 31 may be increased. When the intermediate region 32e is amorphous, the intermediate region 32e functions as a barrier for the diffusion of the metal, and thus, the diffusion of the metal into the high resistance layer 31 can be further prevented. Therefore, the deterioration of the characteristics of the memory cell MC can be prevented, and the reliability of the memory device can be improved.

According to the some embodiments, the upper region 32f maybe formed of a crystallized metal oxide. Thus, the upper region 32f can contribute to the expression and the disappearance of the oxygen deficiency. Thus, the high characteristics of the memory cell MC may be implemented with the same film thickness of the low resistance layer 32, for example, as compared with the case where the upper region 32f is made entirely amorphous.

According to some embodiments, the low resistance layer 32 may be made thin. Thus, the downsizing of the memory cell MC may be implemented.

Although the case where the intermediate region 32e is a single layer has been described as an example, the intermediate region 32e having a plurality of layers may be provided in the low resistance layer 32.

As described above, according to some embodiments, the memory device of which reliability may be improved may be implemented. Further, the downsizing of the memory cell MC may be implemented.

A memory device of some embodiments is the same as those of the embodiments illustrated in FIG. 1, FIG. 2, FIG. 4 and FIG. 5, except that, in the memory device, the memory cell array may have a three-dimensional structure. Thus, descriptions overlapping with those of the embodiments illustrated in FIG. 1 to FIG. 5 will be omitted.

Figure 6:
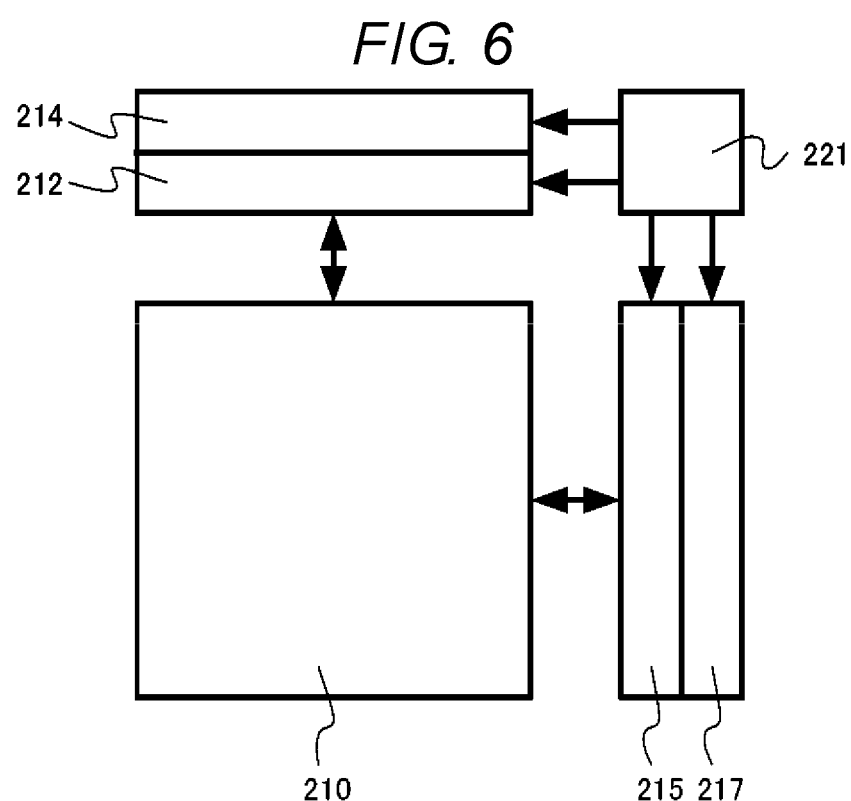
FIG. 6 is a block diagram of a memory device according to some embodiments.
Figure 7:
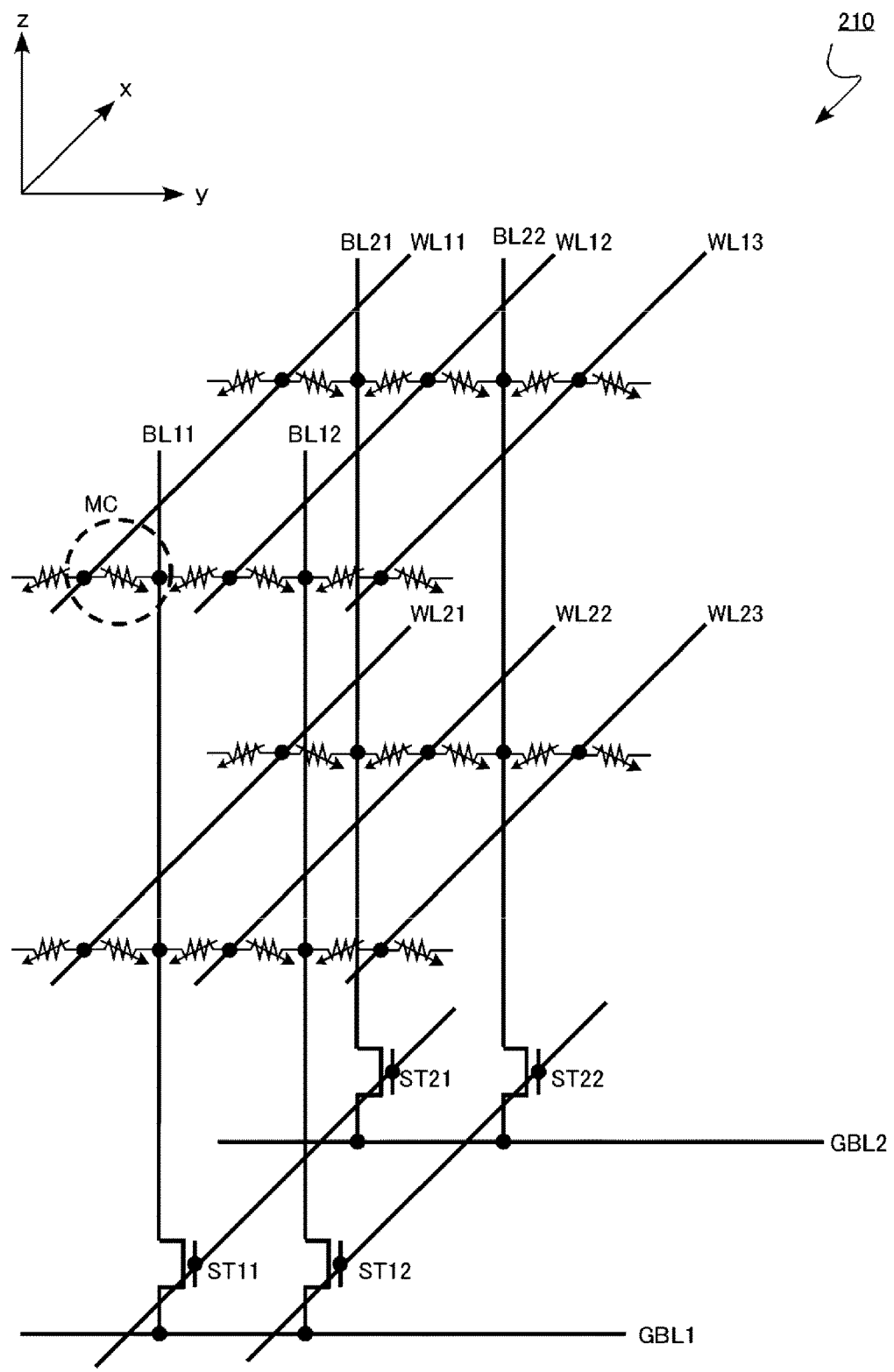
FIG. 7 is an equivalent circuit diagram of a memory cell array of some embodiments.

FIG. 6 is a block diagram of the memory device of some embodiments. FIG. 7 is an equivalent circuit diagram of the memory cell array. FIG. 8 schematically illustrates a wiring structure in the memory cell array.

In addition, the memory cell array of some embodiments may have a three-dimensional structure in which memory cells MC are three-dimensionally arranged.

As illustrated in FIG. 6, the memory device may include a memory cell array 210, a word line driver circuit 212, a row decoder circuit 214, a sense amplifier circuit 215, a column decoder circuit 217, and a control circuit 221.

In some embodiments, as illustrated in FIG. 7, a plurality of memory cells MC may be three-dimensionally arranged in the memory cell array 210. In FIG. 7, the region surrounded by the dashed circle may correspond to one memory cell MC.

The memory cell array 210 may include, for example, a plurality of word lines WL (WL11, WL12, WL13, WL21, WL22, and WL23) and a plurality of bit lines BL (BL11, BL12, BL21, and BL22). The word lines WL may extend in the x direction. The bit lines BL may extend in the z direction. The word lines WL and the bit lines BL may cross vertically each other. The memory cells MC may be arranged at the intersections of the word lines WL and the bit lines BL.

The plurality of word lines WL may be electrically connected to the row decoder circuit 214. The plurality of bit lines BL may be connected to the sense amplifier circuit 215. Selection transistors ST (e.g., ST11, ST21, ST12, and ST22) and global bit lines GBL (e.g., GBL1 and GBL2) may be provided between the plurality of bit lines BL and the sense amplifier circuit 215.

The row decoder circuit 214 may have a function of selecting a word line WL according to an input row address signal. The word line driver circuit 212 may have a function of applying a predetermined voltage to the word line WL selected by the row decoder circuit 214.

The column decoder circuit 217 may have a function of selecting a bit line BL according to an input column address signal. The sense amplifier circuit 215 may have a function of applying a predetermined voltage to the bit line BL selected by the column decoder circuit 217. Further, the sense amplifier circuit 215 may have a function of detecting and amplify a current flowing between the selected word line WL and the selected bit line BL.

The control circuit 221 may have a function of controlling the word line driver circuit 212, the row decoder circuit 214, the sense amplifier circuit 215, the column decoder circuit 217, and other circuits (not illustrated).

The circuits such as the word line driver circuit 212, the row decoder circuit 214, the sense amplifier circuit 215, the column decoder circuit 217, and the control circuit 221 may be formed with, for example, transistors using semiconductor layers or wiring layers (not illustrated).

Figure 8A:
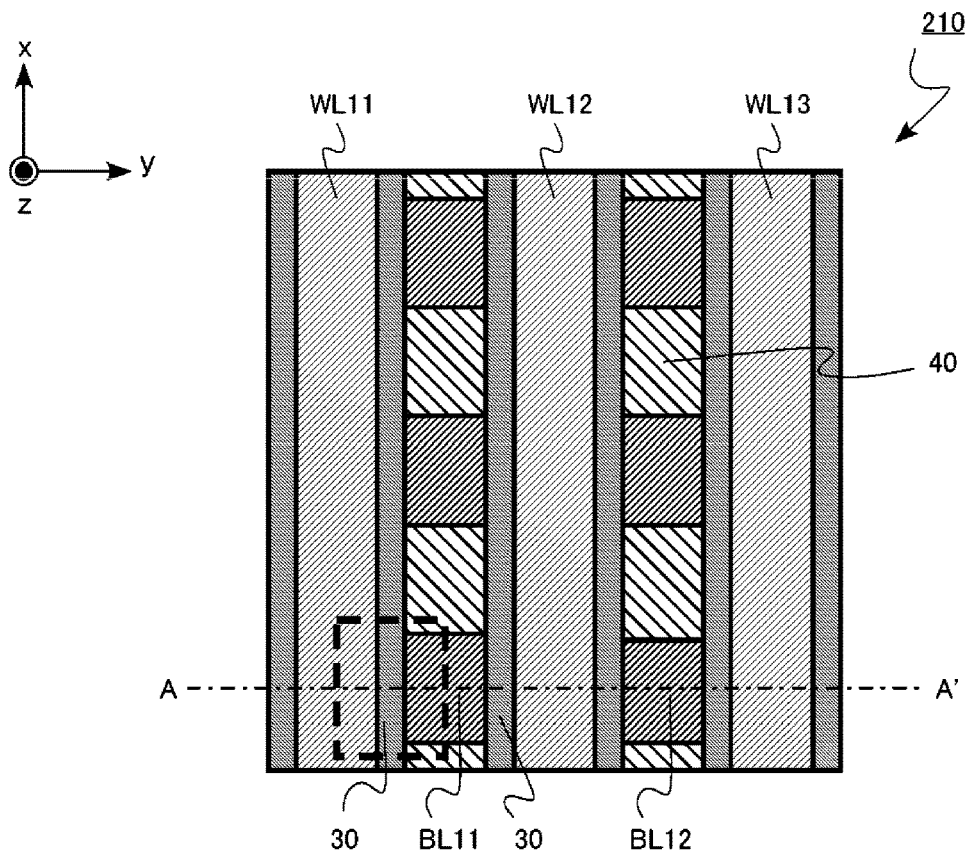
FIG. 8A and FIG. 8B are schematic cross-sectional views of the memory cell array of the memory device of some embodiments.
Figure 8B:
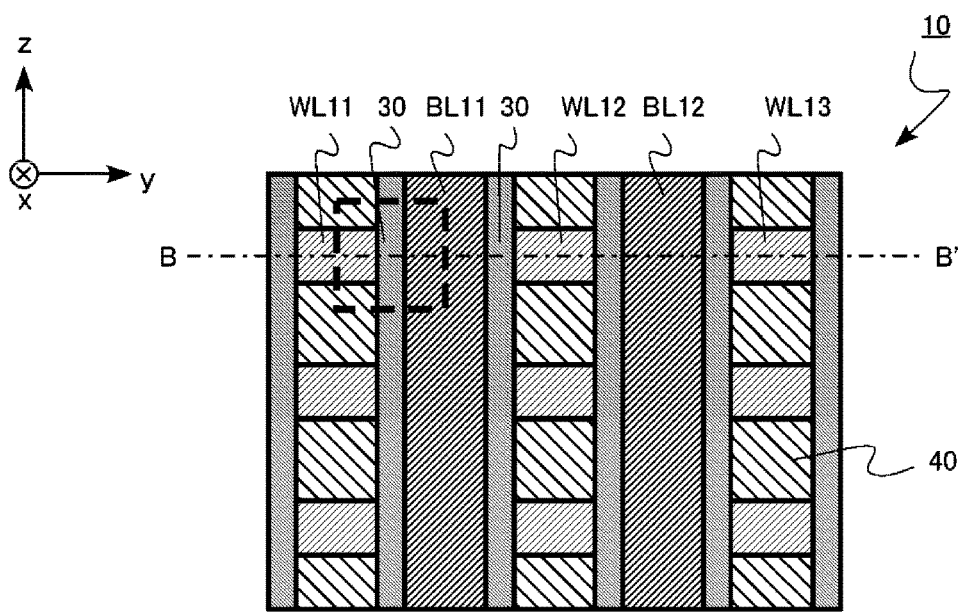

FIG. 8A and FIG. 8B are schematic cross-sectional views of the memory cell array 210 of the memory device of some embodiments. FIG. 8A is an xy cross-sectional view of the memory cell array 210. FIG. 8B is a yz cross-sectional view of the memory cell array 210. FIG. 8A is a cross-sectional view taken along line BB' of FIG. 8B, and FIG. 8B is a cross-sectional view taken along line AA' of FIG. 8A. In each of FIG. 8A and FIG. 8B, the region surrounded by the dashed square is one memory cell MC.

The memory cell array 210 includes the word lines WL11, WL12, and WL13 and the bit lines BL11 and BL12. Further, the memory cell array 210 includes the variable resistance layer 30 and an interlayer insulating layer 40.

The variable resistance layer 30 may be the same as the variable resistance layer 30 as illustrated in FIG. 1 to FIG. 5. Since the variable resistance layer 30 of the embodiments illustrated in FIG. 1 to FIG. 5 may be made thin, and therefore suitable for the downsizing of the memory cell array 210 having the three-dimensional structure in the horizontal direction (e.g., the x direction and the y direction).

According to some embodiments, by having the three-dimensional structure, an effect in improving the degree of integration of the memory device may be obtained, in addition to the effects of the embodiments illustrated in FIG. 1, FIG. 3, FIG. 4 and FIG. 5.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. For example, constituent elements of one embodiment may be replaced with those of another embodiment or may be modified. The accompanying claims and their equivalents are intended to cover such forms or modifications as would fall within the scope and spirit of the present disclosure.

What is claimed is:

1. A memory device comprising:
    a first conductive layer;
    a second conductive layer; and
    a variable resistance layer provided between the first conductive layer and the second conductive layer,
    wherein the variable resistance layer includes
        a first layer including a semiconductor or a first metal oxide including a first metal, and
        a second layer provided between the first layer and the second conductive layer, including a second metal oxide including a second metal, and including crystal grains that are not in contact with at least one of an end face of the second layer on a side of the first conductive layer or an end face of the second layer on a side of the second conductive layer,
    wherein the second layer includes a first region having a first average grain size, and a second region provided between the first region and the second conductive layer and having a second average grain size smaller than the first average grain size, the first layer having a higher resistance than the second layer.

2. The memory device according to claim 1, wherein the second metal is different from the first metal.

3. The memory device according to claim 1, wherein the second metal is at least one element selected from the group consisting of titanium, niobium, tantalum, and tungsten.

4. The memory device according to claim 1, wherein the semiconductor is silicon or germanium, or
the first metal is at least one element selected from the group consisting of aluminum, hafnium, zirconium, tantalum, and niobium.

5. The memory device according to claim 1, wherein the second region is amorphous.

6. A memory device comprising:
a first conductive layer;
a second conductive layer; and
a variable resistance layer provided between the f first conductive layer and the second conductive layer,
wherein the variable resistance layer includes
a first layer including a semiconductor or a first metal oxide including a first metal, and
a second layer provided between the first layer and the second conductive layer, including a second metal oxide including a second metal, and including crystal grains that are not in contact with at least one of an end face of the second layer on a side of the first conductive layer or an end face of the second layer on a side of the second conductive layer,
wherein the second layer includes a first region having a first average grain size, and a second region provided between the first region and the second conductive layer and having a second average grain size smaller than the first average grain size,
wherein the second layer further includes a third region provided between the second region and the second conductive layer and having a third average grain size larger than the second average grain size, and
the second region has a composition different from compositions of the first region and the third region.

7. The memory device according to claim 6, wherein the second region is amorphous.

8. The memory device according to claim 6, wherein the second region includes an oxide or a nitride, and
the oxide or nitride includes at least one element selected from the group consisting of aluminum, silicon, and germanium.

9. The memory device according to claim 6, wherein a film thickness of the second region is 1 nm or less.

10. A memory device comprising:
a first conductive layer;
a second conductive layer; and
a variable resistance layer provided between the first and second conductive layers, wherein the variable resistance layer includes
a first layer including a semiconductor or a first metal oxide including a first metal, and
a second layer provided between the first layer and the second conductive layer, including a second metal oxide including a second metal, and including a first region having a first average grain size and a second region provided between the first region and the second conductive layer and having a second average grain size smaller than the first average grain size, the first layer having a higher resistance than the second layer.

11. The memory device according to claim 10, wherein the second metal is different from the first metal.

12. The memory device according to claim 10, wherein the second metal is at least one element selected from the group consisting of titanium, niobium, tantalum, and tungsten.

13. The memory device according to claim 10, wherein the semiconductor is silicon or germanium, or
the first metal is at least one element selected from the group consisting of aluminum, hafnium, zirconium, tantalum, and niobium.

14. The memory device according to claim 10, wherein the second region is amorphous.

15. The memory device according to claim 10, wherein the variable resistance layer further includes a third layer provided between the first and second layers, having a composition different from compositions of the first layer and the second layer, and including an oxide or a nitride.

16. A memory device comprising:
a first conductive layer;
a second conductive layer; and
a variable resistance layer provided between the first and second conductive layers,
wherein the variable resistance layer includes
a first layer including a semiconductor or a first metal oxide including a first metal, and
a second layer provided between the first layer and the second conductive layer, including a second metal oxide including a second metal, and including a first region having a first average grain size and a second region provided between the first region and the second conductive layer and having a second average gram size smaller than the first average grain size,
wherein the second layer includes a third region provided between the second region and the second conductive layer and having a third average grain size larger than the second average grain size, and the second region has a composition different from compositions of the first region and the third region.

17. The memory device according to claim 16, wherein the second region is amorphous.

18. The memory device according to claim 16, wherein the second region includes an oxide or a nitride, and
the oxide or nitride includes at least one element selected from the group consisting of aluminum, silicon, and germanium.

19. The memory device according to claim 16, wherein a film thickness of the second region is 1 nm or less.

* * * * *